(12) United States Patent
Khlat

(10) Patent No.: US 10,090,809 B1
(45) Date of Patent: Oct. 2, 2018

(54) MULTI-MODE MOBILE POWER MANAGEMENT CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/830,686

(22) Filed: Dec. 4, 2017

Related U.S. Application Data

(60) Provisional application No. 62/545,526, filed on Aug. 15, 2017.

(51) Int. Cl.
| | |
|---|---|
| H04B 1/04 | (2006.01) |
| H03F 1/02 | (2006.01) |
| H03F 3/19 | (2006.01) |

(52) U.S. Cl.
CPC ............ *H03F 1/0227* (2013.01); *H03F 3/19* (2013.01); *H04B 1/04* (2013.01); *H03F 2200/105* (2013.01); *H03F 2200/451* (2013.01)

(58) Field of Classification Search
CPC ............ H03F 1/0227; H03F 3/19; H04B 1/04
USPC ..................................................... 455/127.4
See application file for complete search history.

(56) References Cited

U.S. PATENT DOCUMENTS

| | | | |
|---|---|---|---|
| 6,434,122 B2 | 8/2002 | Barabash et al. | |
| 8,008,970 B1 * | 8/2011 | Homol | H03F 3/72 330/296 |
| 8,909,175 B1 | 12/2014 | McCallister | |
| 9,484,865 B2 | 11/2016 | Kobayashi et al. | |
| 2006/0244513 A1 | 11/2006 | Yen et al. | |
| 2009/0045877 A1 | 2/2009 | Wang et al. | |
| 2010/0219887 A1 | 9/2010 | Ichitsubo et al. | |
| 2010/0283534 A1 | 11/2010 | Pierdomenico | |
| 2012/0281597 A1 * | 11/2012 | Khlat | H03F 3/72 370/277 |
| 2013/0141064 A1 * | 6/2013 | Kay | G05F 1/46 323/271 |
| 2013/0141068 A1 * | 6/2013 | Kay | G05F 1/46 323/282 |

(Continued)

OTHER PUBLICATIONS

U.S. Appl. No. 15/678,245, filed Aug. 16, 2017.

(Continued)

*Primary Examiner* — Sanh Phu
(74) *Attorney, Agent, or Firm* — Withrow & Terranova, P.L.L.C.

(57) ABSTRACT

A multi-mode mobile power management circuit is provided. The multi-mode mobile power management circuit includes a dual-mode amplifier circuit(s) configured to amplify a radio frequency (RF) signal for transmission in a defined RF band(s), such as a long-term evolution (LTE) band(s) or a fifth-generation new radio (5G-NR) band(s). The multi-mode mobile power management circuit includes a pair of tracker circuitries coupled to the dual-mode amplifier circuit. Each tracker circuitry includes a charge pump circuitry configured to generate a voltage and a current. When the dual-mode amplifier circuit amplifies the RF signal for transmission in the 5G-NR band(s), both charge pump circuitries are controlled to provide two currents to the dual-mode amplifier circuit. As a result, the dual-mode amplifier circuit is able to amplify the RF signal to a higher power corresponding to a sum of the two currents for transmission in the 5G-NR band(s).

20 Claims, 4 Drawing Sheets

(56) References Cited

U.S. PATENT DOCUMENTS

| | | |
|---|---|---|
| 2013/0165132 A1 | 6/2013 | Goedken et al. |
| 2013/0285750 A1 | 10/2013 | Chowdhury et al. |
| 2014/0105327 A1 | 4/2014 | Geng et al. |
| 2015/0091653 A1 | 4/2015 | Kobayashi et al. |
| 2015/0180422 A1* | 6/2015 | Khlat .................... H03F 1/0244 330/291 |
| 2015/0234402 A1* | 8/2015 | Kay ........................ G05F 1/468 323/271 |
| 2016/0164476 A1 | 6/2016 | Wang et al. |
| 2017/0124013 A1 | 5/2017 | Vaillancourt et al. |

OTHER PUBLICATIONS

U.S. Appl. No. 15/720,894, filed Sep. 29, 2017.
U.S. Appl. No. 15/825,562, filed Nov. 29, 2017.
U.S. Appl. No. 15/856,143, filed Dec. 28, 2017.
U.S. Appl. No. 15/837,496, filed Dec. 11, 2017.
U.S. Appl. No. 15/836,334, filed Dec. 8, 2017.
Ex Parte Quayle Action for U.S. Appl. No. 15/678,245, dated Jun. 6, 2018, 4 pages.
Notice of Allowance for U.S. Appl. No. 15/825,562, dated Jun. 11, 2018, 8 pages.
Notice of Allowance for U.S. Appl. No. 15/837,496, dated May 25, 2018, 8 pages.

* cited by examiner

US 10,090,809 B1

MULTI-MODE MOBILE POWER MANAGEMENT CIRCUIT

RELATED APPLICATIONS

This application claims the benefit of provisional patent application Ser. No. 62/545,526, filed Aug. 15, 2017, the disclosure of which is hereby incorporated herein by reference in its entirety.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation (5G) new radio (NR) (5G-NR) wireless communication systems have been widely regarded as the next wireless communication standard beyond the current third-generation (3G) communication standard, such as wideband code division multiple access (WCDMA), and fourth-generation (4G) communication standard, such as long-term evolution (LTE). The 5G-NR wireless communication system is expected to provide a significantly higher data rate, improved coverage range, enhanced signaling efficiency, and reduced latency compared to wireless communication systems based on the 3G and 4G communication standards. Moreover, the 5G-NR communication system is an orthogonal frequency division multiplexing (OFDM) based wireless system designed to operate across a wide range of radio frequency (RF) bands, which include a low-band (below 1 GHz), a mid-band (1 GHz to 6 GHz), and a high-band (above 24 GHz).

A portion of the 5G-NR RF bands, particularly the low-band and the mid-band, overlaps with the RF bands currently used by the 3G and/or the 4G wireless communication systems. As such, the 5G-NR wireless communication systems are designed to provide greater scalability across all the 5G-NR RF bands. For example, the 5G-NR wireless communication system can scale down to operate in the 3G/4G RF bands based on the 3G/4G wireless communication standard for lower throughput applications and/or in suburban locations, and scale up to operate in the 5G-NR RF bands based on the 5G-NR communication standard for higher throughput applications and/or in urban/indoor locations. As such, it may be desired for the 3G, 4G, and 5G-NR communication standards to coexist in the mobile communication devices.

SUMMARY

Embodiments of the disclosure relate to a multi-mode mobile power management circuit. The multi-mode mobile power management circuit includes a dual-mode amplifier circuit(s) configured to amplify a radio frequency (RF) signal for transmission in a defined RF band(s). In examples discussed herein, the dual-mode amplifier circuit amplifies the RF signal for transmission in a long-term evolution (LTE) band(s) or a fifth-generation new radio (5G-NR) band(s). The multi-mode mobile power management circuit includes a pair of tracker circuitries coupled to the dual-mode amplifier circuit. Each tracker circuitry includes a charge pump circuitry configured to generate a voltage and a current. When the dual-mode amplifier circuit amplifies the RF signal for transmission in the 5G-NR band(s), both charge pump circuitries are controlled to provide two currents to the dual-mode amplifier circuit. As a result, the dual-mode amplifier circuit is able to amplify the RF signal to a higher power corresponding to a sum of the two currents for transmission in the 5G-NR band(s).

In one aspect, a multi-mode mobile power management circuit is provided. The multi-mode mobile power management circuit includes a dual-mode amplifier circuit configured to amplify an RF signal for transmission in at least one defined RF band. The multi-mode mobile power management circuit also includes first tracker circuitry. The first tracker circuitry includes a first tracker output coupled to the dual-mode amplifier circuit. The first tracker circuitry also includes first charge pump circuitry configured to generate a first voltage and a first current at the first tracker output. The multi-mode mobile power management circuit also includes second tracker circuitry. The second tracker circuitry includes a second tracker output coupled to the dual-mode amplifier circuit. The second tracker circuitry also includes second charge pump circuitry configured to generate a second voltage and a second current at the second tracker output. The multi-mode mobile power management circuit also includes control circuitry. The control circuitry is configured to control the first charge pump circuitry and the second charge pump circuitry to provide the first current and the second current to the dual-mode amplifier circuit in a high-power high-bandwidth (HPHB) mode. The dual-mode amplifier circuit is further configured to amplify the RF signal to a defined power level corresponding to a sum of the first current and the second current.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
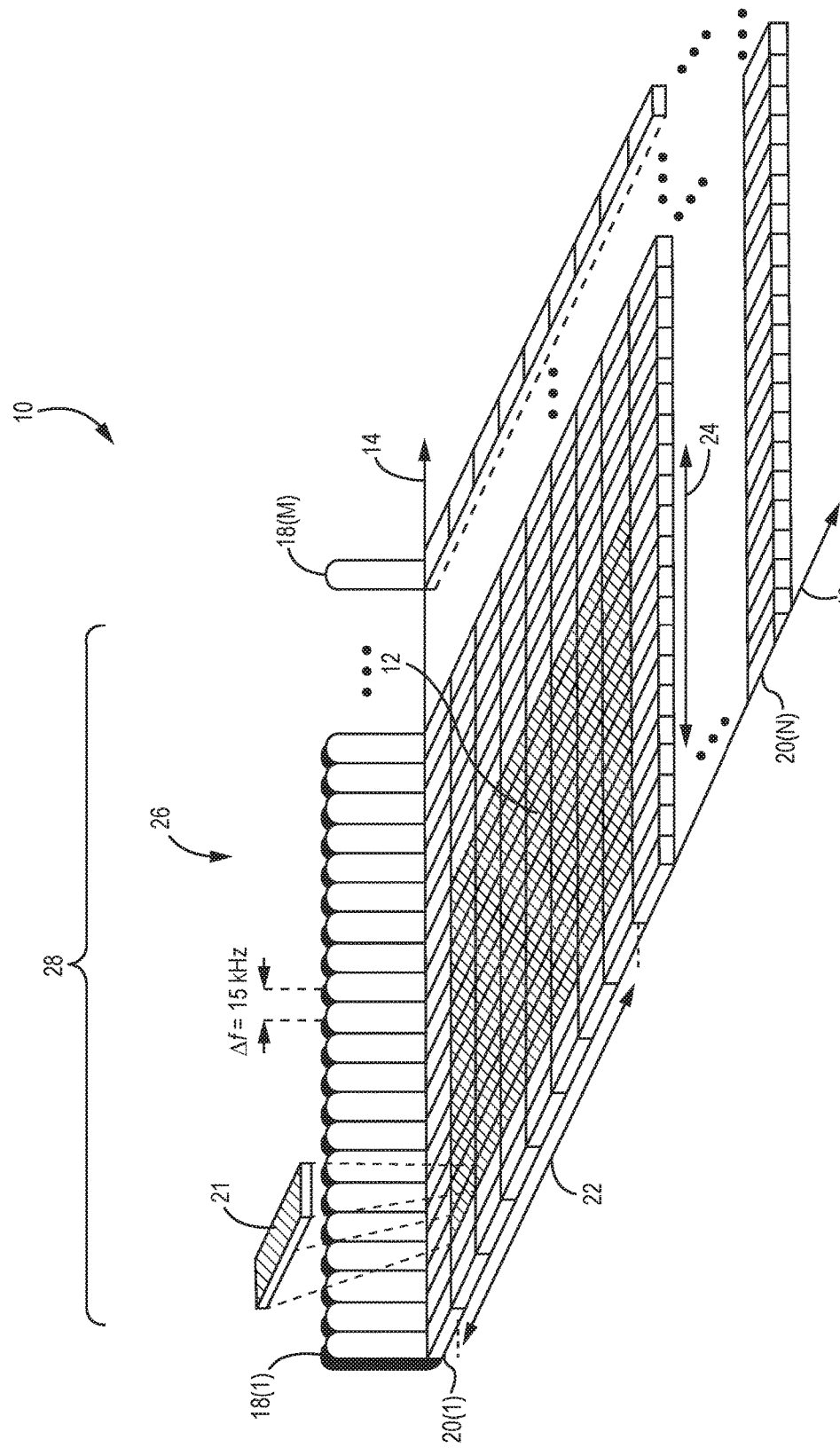
FIG. 1 is a schematic diagram of an exemplary orthogonal frequency division multiplexing (OFDM) time-frequency grid illustrating at least one resource block (RB)

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-mode mobile power management circuit. The multi-mode mobile power management circuit includes a dual-mode amplifier circuit(s) configured to amplify a radio frequency (RF) signal for transmission in a defined RF band(s). In examples discussed herein, the dual-mode amplifier circuit amplifies the RF signal for transmission in a long-term evolution (LTE) band(s) or a fifth-generation new radio (5G-NR) band(s). The multi-mode mobile power management circuit includes a pair of tracker circuitries coupled to the dual-mode amplifier circuit. Each tracker circuitry includes a charge pump circuitry configured to generate a voltage and a current. When the dual-mode amplifier circuit amplifies the RF signal for transmission in the 5G-NR band(s), both charge pump circuitries are controlled to provide two currents to the dual-mode amplifier circuit. As a result, the dual-mode amplifier circuit is able to amplify the RF signal to a higher power corresponding to a sum of the two currents for transmission in the 5G-NR band(s).

Before discussing the multi-mode mobile power management circuit of the present disclosure, a brief overview of an RB-based resource allocation scheme is first provided with reference FIG. 1 to help understand the relationship between bandwidth of an RF signal and the number of RBs allocated to the RF signal. A brief discussion of power management architecture is then provided with reference to FIGS. 2 and 3. The discussion of specific exemplary aspects of a multi-mode mobile power management circuit starts below with reference to FIG. 4.

In this regard, FIG. 1 is a schematic diagram of an exemplary orthogonal frequency division multiplexing (OFDM) time-frequency grid 10 illustrating at least one RB 12. The OFDM time-frequency grid 10 includes a frequency axis 14 and a time axis 16. Along the frequency axis 14, there are a number of subcarriers 18(1)-18(M). The subcarriers 18(1)-18(M) are orthogonally separated from each other by a frequency spacing $\Delta f$ of 15 KHz. Along the time axis 16, there are a number of OFDM symbols 20(1)-20(N). Each intersection of the subcarriers 18(1)-18M and the OFDM symbols 20(1)-20(N) defines a resource element (RE) 21.

In one example, the RB 12 includes twelve (12) consecutive subcarriers among the subcarriers 18(1)-18(M), and seven (7) consecutive OFDM symbols among the OFDM symbols 20(1)-20(N). In this regard, the RB 12 includes eighty-four (84) of the REs 21 (12 subcarriers×7 OFDM symbols). The RB 12 has an RB duration 22, which equals one-half millisecond (0.5 ms), along the time axis 16. Accordingly, the RB 12 has a bandwidth 24, which equals 180 KHz (15 KHz/subcarrier×12 subcarriers), along the frequency axis 14. In OFDM-based communication systems such as long-term evolution (LTE), the RB 12 is the minimum unit for allocating resources to users.

In an LTE system, an RF signal 26 can occupy multiple subcarriers among the subcarriers 18(1)-18(N). In this regard, a signal bandwidth 28 of the RF signal 26 is a function of the number of RBs 12 contained in the RF signal 26 along the frequency axis 14. In this regard, if the RF signal 26 contains ten (10) RBs 12, then the signal bandwidth 28 will be 1.8 MHz (180 KHz/RB×10 RBs). If the RF signal 26 contains twenty-five (25) RBs 12, then the signal bandwidth 28 will be 4.5 MHz (180 KHz/RB×25 RBs). If the RF signal 26 contains two hundred (200) RBs 12, then the signal bandwidth 28 will be 36 MHz (180 KHz/RB×200 RBs). In this regard, the more RBs 12 the RF signal 26 contains, the wider the signal bandwidth 28 will be, and the more subcarriers among the subcarriers 18(1)-18(M) are modulated within the RB duration 22. As such, the RF signal 26 can exhibit more and faster amplitude variations within the RB duration 22 when the RF signal 26 is modulated according to a selected modulation and coding scheme (MCS). As a result, when the RF signal 26 is amplified for transmission over a wireless medium, an ET amplifier circuit would need to operate fast enough to keep up with the faster amplitude variations of the RF signal 26 across the signal bandwidth 28 within the RB duration 22.

Figure 2:
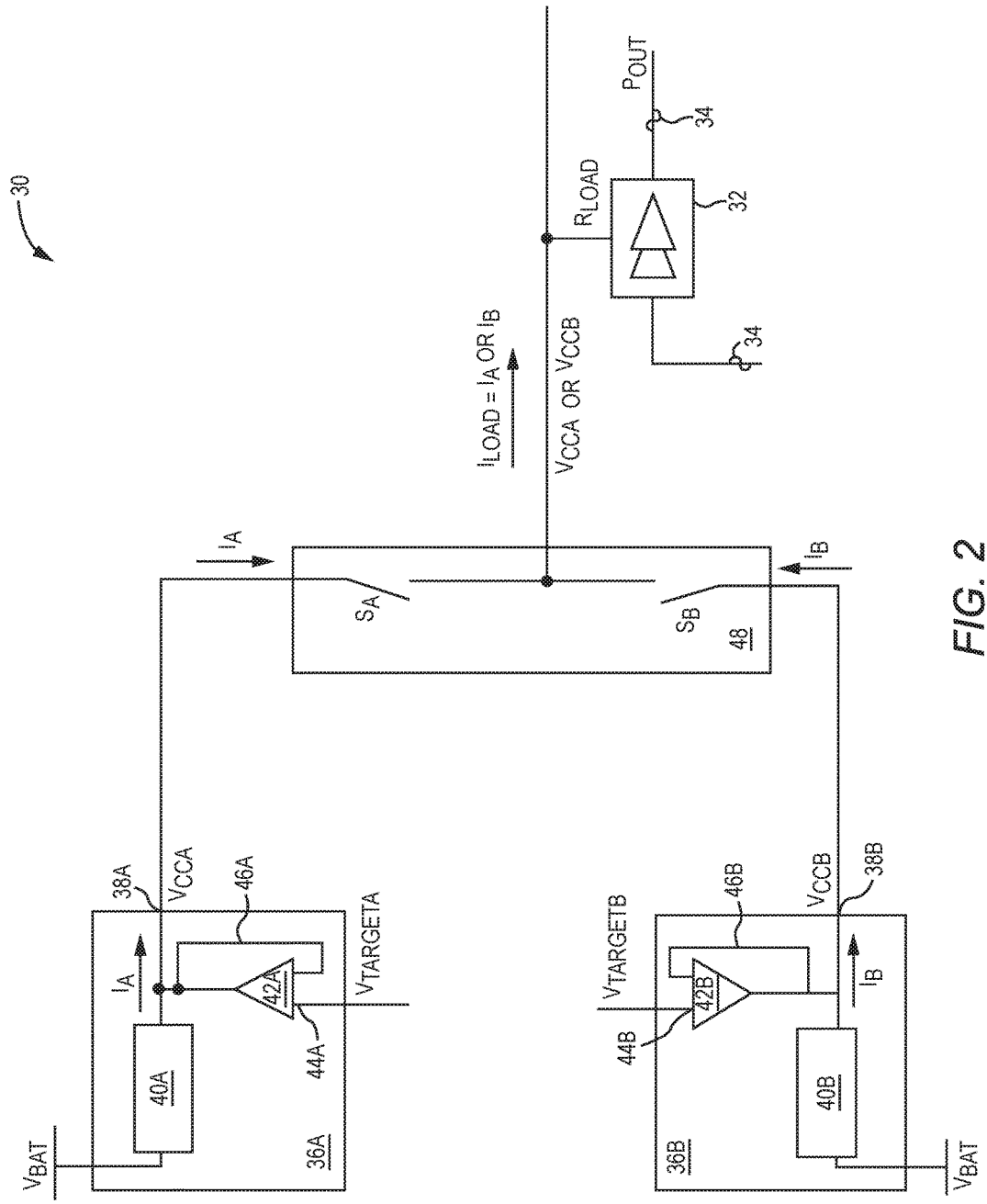
FIG. 2 is a schematic diagram of an exemplary power management circuit including a dual-mode amplifier circuit configured to amplify a radio frequency (RF) signal for transmission in an RF band(s)

FIG. 2 is a schematic diagram of an exemplary power management circuit 30 including a dual-mode amplifier circuit 32 configured to amplify an RF signal 34 for transmission in an RF band(s). In a non-limiting example, the dual-mode amplifier circuit 32 operates in a first transmission mode when the RF signal 34 is transmitted in a 5G-NR RF band and in a second transmission mode when the RF signal 34 is transmitted in a fourth-generation (4G) RF band.

The power management circuit 30 includes first tracker circuitry 36A and second tracker circuitry 36B. The first tracker circuitry 36A includes a first tracker output 38A coupled to the dual-mode amplifier circuit 32. The first tracker circuitry 36A includes first charge pump circuitry 40A and a first parallel amplifier 42A. The first charge pump circuitry 40A receives a battery voltage $V_{BAT}$ and generates a first current $I_A$, which can be a direct current (DC) current, an alternate current (AC) current, or a combination of both, at the first tracker output 38A. The first charge pump circuitry 40A can also generate a first voltage $V_{CCA}$, which will be an average power tracking (APT) voltage, at the first tracker output 38A. The first parallel amplifier 42A is configured to generate a first modulated voltage $V_{CCA}$, which will be an envelope tracking (ET) modulated voltage, at the first tracker output 38A. In this regard, the first parallel amplifier 42A receives a first target voltage $V_{TARGETA}$ at a first voltage input 44A and generates the first modulated voltage $V_{CCA}$ tracking the first target voltage $V_{TARGETA}$. The first target voltage $V_{TARGETA}$ can be an ET voltage. Accordingly, the first parallel amplifier 42A generates the first modulated voltage $V_{CCA}$ as a first ET modulated voltage. The first parallel amplifier 42A is coupled to a first feedback loop 46A, which provides a sample of the first modulated voltage $V_{CCA}$ back to the first parallel amplifier 42A.

The second tracker circuitry 36B includes a second tracker output 38B coupled to the dual-mode amplifier circuit 32. The second tracker circuitry 36B includes second charge pump circuitry 40B and a second parallel amplifier 42B. The second charge pump circuitry 40B receives the battery voltage $V_{BAT}$ and generates a second current $I_B$, which can be a DC current, an AC current, or a combination of both, at the second tracker output 38B. The second charge pump circuitry 40B can also generate a second voltage $V_{CCB}$, which will be an APT voltage, at the second tracker output 38B. The second parallel amplifier 42B is configured to generate a second modulated voltage $V_{CCB}$, which will be an ET modulated voltage, at the second tracker output 38B. In this regard, the second parallel amplifier 42B receives a second target voltage $V_{TARGETB}$ at a second voltage input 44B and generates the second modulated voltage $V_{CCB}$ tracking the second target voltage $V_{TARGETB}$. The second target voltage $V_{TARGETB}$ can be an ET voltage. Accordingly, the second parallel amplifier 42B generates the second modulated voltage $V_{CCB}$ as a second ET modulated voltage. The second parallel amplifier 42B is coupled to a second feedback loop 46B, which provides a sample of the second modulated voltage $V_{CCB}$ back to the second parallel amplifier 42B.

The power management circuit 30 includes voltage switching circuitry 48, which includes switches $S_A$ and $S_B$. The voltage switching circuitry 48 may be controlled to selectively couple the dual-mode amplifier circuit 32 to the first tracker circuitry 36A or the second tracker circuitry 36B. Notably, the switches $S_A$ and $S_B$ are provided herein merely as non-limiting examples. It should be appreciated that the voltage switching circuitry 48 may be implemented based on any type, number, and/or configuration of switches without affecting operating principles of the power management circuit 30.

When the switch $S_A$ is closed and the switch $S_B$ is open, the dual-mode amplifier circuit 32 is coupled to the first tracker output 38A to receive the first voltage $V_{CCA}$ (APT voltage) or the first modulated voltage $V_{CCA}$ (ET voltage) and the first current $I_A$. The dual-mode amplifier circuit 32 has a load line $R_{LOAD}$, which induces a load current $I_{LOAD}$ based on the first modulated voltage $V_{CCA}$ ($I_{LOAD}=V_{CCA} \div R_{LOAD}$). The load current $I_{LOAD}$ and the load line $R_{LOAD}$ cause the RF signal 34 to be amplified to a determined power $P_{OUT}$ ($P_{OUT}=I_{LOAD} \times V_{CCA}$).

When the switch $S_B$ is closed and switch $S_A$ is open, the dual-mode amplifier circuit 32 is coupled to the second tracker output 38B to receive the second voltage $V_{CCA}$ (APT voltage) or the second modulated voltage $V_{CCB}$ (ET voltage) and the second current $I_B$. Accordingly, the load line $R_{LOAD}$ induces the load current $I_{LOAD}$ based on the second modulated voltage $V_{CCB}$ ($I_{LOAD}=V_{CCB} \div R_{LOAD}$). The load current $I_{LOAD}$ and the load line $R_{LOAD}$ cause the RF signal 34 to be amplified to the determined power $P_{OUT}$ ($P_{OUT}=I_{LOAD} \times V_{CCB}$).

When the RF signal 34 is transmitted in the 5G-NR band(s), the dual-mode amplifier circuit 32 needs to be able to amplify the RF signal 34 to a Class 2 peak power (e.g., ≥26 dBm). For example, the RF signal 34 transmitted in the 5G-NR band(s) includes a higher number of RBs (e.g., ≥400 RBs). Accordingly, the peak power of the RF signal 34 needs to be at least 28.5 dBm. If the dual-mode amplifier circuit 32 has power amplifier efficiency (PAE) at 45% and the first modulated voltage $V_{CCA}$ or the second modulated voltage $V_{CCB}$ received by the dual-mode amplifier circuit 32 is at 5 V, the peak current required by the dual-mode amplifier circuit 32 would be approximately 314.6 mA. In this regard, when the first tracker circuitry 36A is coupled to the dual-mode amplifier circuit 32, the first tracker circuitry 36A would be required to provide the first modulated voltage $V_{CCA}$ at 5 V, while maintaining the first current $I_A$ above 314.6 mA. Likewise, when the second tracker circuitry 36B is coupled to the dual-mode amplifier circuit 32, the second tracker circuitry 36B would be required to provide the second modulated voltage $V_{CCB}$ at 5 V, while maintaining the second current $I_B$ above 314.6 mA.

Figure 3:
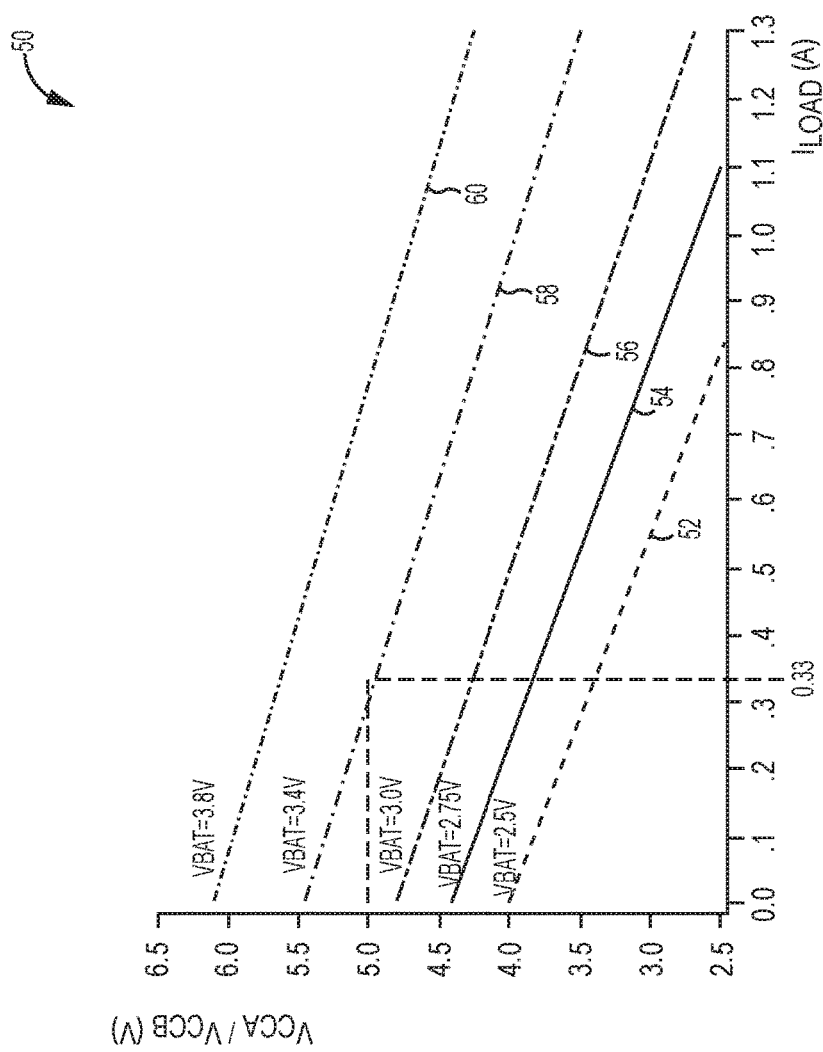
FIG. 3 is a voltage-current graph providing exemplary illustration of current and voltage boosting capability of the power management circuit of FIG. 2.

However, it may be difficult for the first tracker circuitry 36A or the second tracker circuitry 36B to concurrently maintain a higher level of modulated voltage and current concurrently. In this regard, FIG. 3 is a voltage-current graph 50 providing an exemplary illustration of current and voltage boosting capability of the first tracker circuitry 36A and the second tracker circuitry 36B of FIG. 2. Elements of FIG. 2 are referenced herein in conjunction with FIG. 3 and will not be re-described herein.

The voltage-current graph 50 includes a first voltage-current curve 52, a second voltage-current curve 54, a third voltage-current curve 56, a fourth voltage-current curve 58, and a fifth voltage-current curve 60. The first voltage-current curve 52 represents a voltage-vs-current relationship between the first modulated voltage $V_{CCA}$ or the second modulated voltage $V_{CCB}$ and the load current $I_{LOAD}$ when the battery voltage $V_{BAT}$ is at 2.5 V. The second voltage-current curve 54 represents a voltage-vs-current relationship between the first modulated voltage $V_{CCA}$ or the second modulated voltage $V_{CCB}$ and the load current $I_{LOAD}$ when the battery voltage $V_{BAT}$ is at 2.75 V. The third voltage-current curve 56 represents a voltage-vs-current relationship between the first modulated voltage $V_{CCA}$ or the second modulated voltage $V_{CCB}$ and the load current $I_{LOAD}$ when the battery voltage $V_{BAT}$ is at 3.0 V. The fourth voltage-current curve 58 represents a voltage-vs-current relationship between the first modulated voltage $V_{CCA}$ or the second modulated voltage $V_{CCB}$ and the load current $I_{LOAD}$ when the battery voltage $V_{BAT}$ is at 3.4 V. The fifth voltage-current curve 60 represents a voltage-vs-current relationship between the first modulated voltage $V_{CCA}$ or the second modulated voltage $V_{CCB}$ and the load current $I_{LOAD}$ when the battery voltage $V_{BAT}$ is at 3.8 V. In a non-limiting example, the first voltage-current curve 52, the second voltage-current curve 54, the third voltage-current curve 56, the fourth voltage-current curve 58, and the fifth voltage-current curve 60 can be obtained through simulations.

According to the fourth voltage-current curve 58, when the first modulated voltage $V_{CCA}$ or the second modulated voltage $V_{CCB}$ is provided at 5 V, the peak load current $I_{LOAD}$ is approximately 330 mA. Further increasing the peak load current $I_{LOAD}$ beyond 330 mA would cause the first modulated voltage $V_{CCA}$ or the second modulated voltage $V_{CCB}$ to drop below 5 V. As such, the load current $I_{LOAD}$ can be said to be inversely related to the first modulated voltage $V_{CCA}$ or the second modulated voltage $V_{CCB}$.

While the 330 mA peak load current $I_{LOAD}$ is marginally above the peak current (314.6 mA) required by the dual-mode amplifier circuit 32 to amplify the RF signal 34 to the peak power of 28.5 dBm, there is very little margin left for a voltage standing wave ratio (VSWR) variation that can increase demand for the load current $I_{LOAD}$. Hence, it may be desirable to boost the load current $I_{LOAD}$, while maintaining the first modulated voltage $V_{CCA}$ or the second modulated voltage $V_{CCB}$, such that the dual-mode amplifier circuit 32 can amplify the RF signal 34 to the desired power level (e.g., power class 2). Moreover, it may be desirable to boost the load current $I_{LOAD}$ without significantly changing the power management circuit 30 of FIG. 2.

Figure 4:
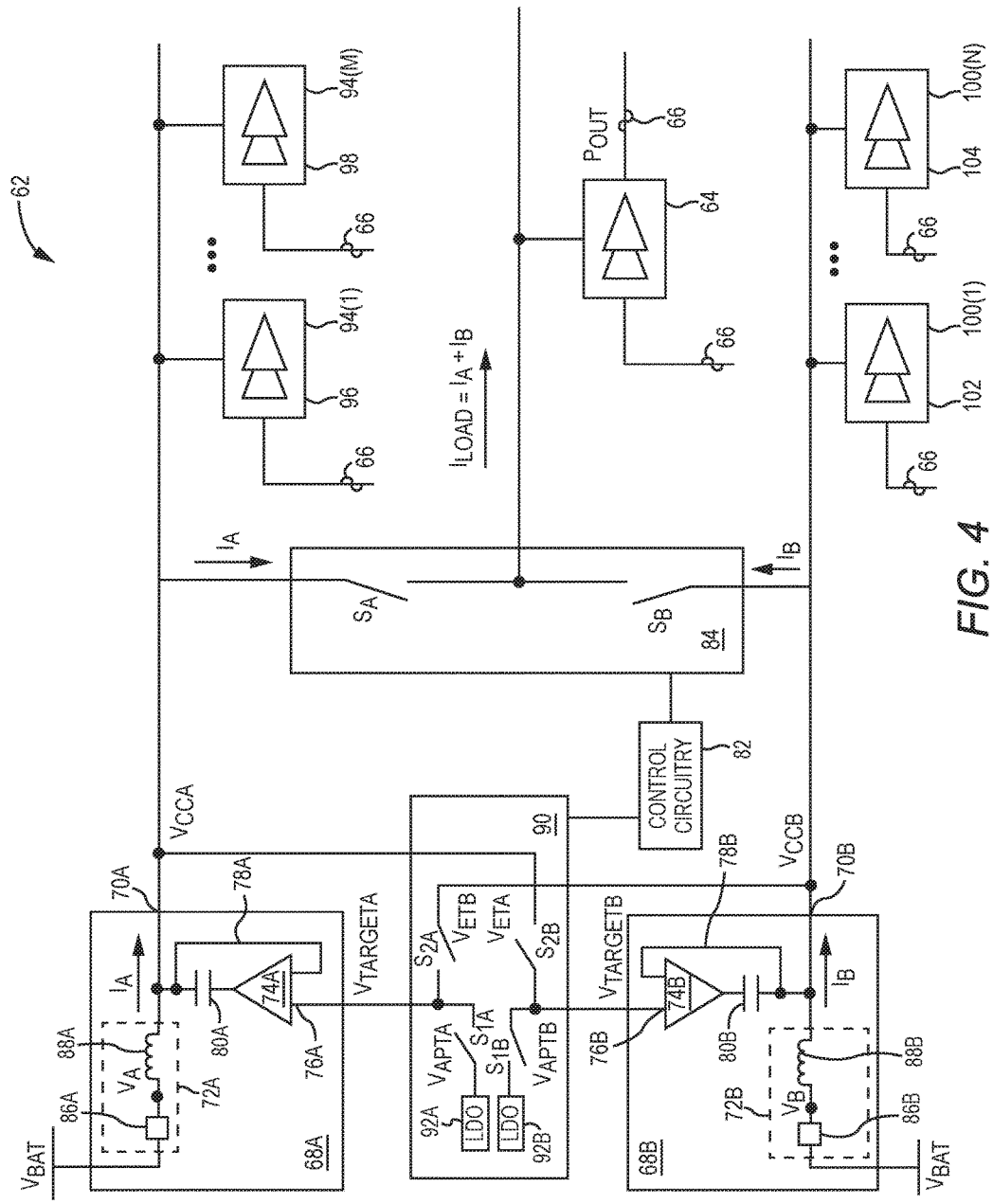
FIG. 4 is a schematic diagram of an exemplary multi-mode mobile power management circuit according to one embodiment of the present disclosure.

In this regard, FIG. 4 is a schematic diagram of an exemplary multi-mode mobile power management circuit 62 according to one embodiment of the present disclosure. The multi-mode mobile power management circuit 62 includes a dual-mode amplifier circuit 64 configured to amplify an RF signal 66 to a defined power level $P_{OUT}$ for transmission in at least one defined RF band. In a non-limiting example, the defined RF band can include LTE band 42 (3400-3600 MHz), LTE band 43 (3600-3800 MHz), and/or LTE band 48 (3550-3700 MHz), which are shared between 4G LTE and 5G-NR transmissions.

In examples discussed hereinafter, the dual-mode amplifier circuit 64 can be dynamically configured to operate in a high-power high-bandwidth (HPHB) mode, a low-power high-bandwidth (LPHB) mode, and a low-power low-bandwidth (LPLB) mode.

When the multi-mode mobile power management circuit 62 operates in the HPHB mode, the RF signal 66 includes more than 400 RBs. Accordingly, the dual-mode amplifier circuit 64 is configured to amplify the RF signal 66 to the defined power level $P_{OUT}$ of greater than or equal to 26 dBm (power class 2) at more than 80 MHz (>80 MHz) modulation bandwidth. In a non-limiting example, in the HPHB mode, the RF signal 66 is transmitted in a 5G-NR RF band.

When the multi-mode mobile power management circuit 62 operates in the LPHB mode, the RF signal 66 includes more than 400 RBs. Accordingly, the dual-mode amplifier circuit 64 is configured to amplify the RF signal 66 to the defined power level $P_{OUT}$ lesser than or equal to 23 dBm at more than 80 MHz (>80 MHz) modulation bandwidth. In a non-limiting example, in the LPHB mode, the RF signal 66 is transmitted in a 5G-NR RF band and a 4G RF band in uplink carrier aggregation (ULCA).

When the multi-mode mobile power management circuit 62 operates in the LPLB mode, the RF signal 66 includes less than 400 RBs. Accordingly, the dual-mode amplifier circuit 64 is configured to amplify the RF signal 66 to the defined power level $P_{OUT}$ lesser than or equal to 23 dBm at lesser than or equal to 80 MHz (≤80 MHz) modulation bandwidth. In a non-limiting example, in the LPLB mode, the RF signal 66 is transmitted in two 4G RF bands in ULCA.

The multi-mode mobile power management circuit 62 includes first tracker circuitry 68A and second tracker circuitry 68B. The first tracker circuitry 68A includes a first tracker output 70A coupled to the dual-mode amplifier circuit 64. The first tracker circuitry 68A includes first charge pump circuitry 72A and a first parallel amplifier 74A. The first charge pump circuitry 72A receives a battery voltage $V_{BAT}$ and generates a first current $I_A$, which can be a DC current, an AC current, or a combination of both, at the first tracker output 70A. The first charge pump circuitry 72A can also generate a first voltage $V_{CCA}$, which will be an APT voltage, at the first tracker output 70A. The first parallel amplifier 74A is configured to generate a first modulated voltage $V_{CCA}$, which will be an ET modulated voltage, at the first tracker output 70A. In this regard, the first parallel amplifier 74A receives a first target voltage $V_{TARGETA}$ at a first voltage input 76A and generates the first modulated voltage $V_{CCA}$ tracking the first target voltage $V_{TARGETA}$. The first target voltage $V_{TARGETA}$ can be an ET voltage. Accordingly, the first parallel amplifier 74A generates the first modulated voltage $V_{CCA}$ as a first ET modulated voltage. The first parallel amplifier 74A is coupled to a first feedback loop 78A, which provides a sample of the first modulated voltage $V_{CCA}$ back to the first parallel amplifier 74A. The first parallel amplifier 74A is coupled to the first tracker output 70A via a first offset capacitor 80A, which is configured to raise the first modulated voltage $V_{CCA}$ presented at the first tracker output 70A.

The second tracker circuitry 68B, which can be symmetrical to the first tracker circuitry 68A for example, includes a second tracker output 70B coupled to the dual-mode amplifier circuit 64. The second tracker circuitry 68B includes second charge pump circuitry 72B and a second parallel amplifier 74B. The second charge pump circuitry 72B receives the battery voltage $V_{BAT}$ and generates a second current $I_B$, which can be a DC current, an AC current, or a combination of both, at the second tracker output 70B. The second charge pump circuitry 72B can also generate a second voltage $V_{CCB}$, which will be an APT voltage, at the second tracker output 70B. The second parallel amplifier 74B is configured to generate a second modulated voltage $V_{CCB}$, which will be an ET modulated voltage, at the second tracker output 70B. In this regard, the second parallel amplifier 74B receives a second target voltage $V_{TARGETB}$ at a second voltage input 76B and generates the second modulated voltage $V_{CCB}$ tracking the second target voltage $V_{TARGETB}$. The second target voltage $V_{TARGETB}$ can be an ET voltage. Accordingly, the second parallel amplifier 74B generates the second modulated voltage $V_{CCB}$ as a second ET modulated voltage. The second parallel amplifier 74B is coupled to a second feedback loop 78B, which provides a sample of the second modulated voltage $V_{CCB}$ back to the second parallel amplifier 74B. The second parallel amplifier 74B is coupled to the second tracker output 70B via a second offset capacitor 80B, which is configured to raise the second modulated voltage $V_{CCB}$ presented at the second tracker output 70B.

The multi-mode mobile power management circuit 62 includes control circuitry 82, which may be implemented by a microprocessor, a microcontroller, or a field-programmable gate array (FPGA). The control circuitry 82 opportunistically and dynamically controls the first tracker circuitry 68A and the second tracker circuitry 68B to support the HPHB mode, the LPHB mode, and the LPLB mode of operations. The multi-mode mobile power management circuit 62 includes voltage switching circuitry 84, which includes switches $S_A$ and $S_B$. As discussed in detail below, the control circuitry 82 can selectively couple the first tracker output 70A and/or the second tracker output 70B to the dual-mode amplifier circuit 64 by opening and/or closing the switches $S_A$ and/or $S_B$. Notably, the switches $S_A$ and $S_B$ are provided herein merely as non-limiting examples. It should be appreciated that the voltage switching circuitry 84 may be implemented based on any type, number, and/or configuration of switches without affecting operating principles of the multi-mode mobile power management circuit 62.

The first charge pump circuitry 72A includes a first multi-level charge pump (MCP) 86A and a first inductor 88A. The first MCP 86A is configured to generate a first MCP voltage $V_A$ below the battery voltage $V_{BAT}$, equal to the battery voltage $V_{BAT}$, or two times the battery voltage $V_{BAT}$. The first MCP voltage $V_A$ causes the first inductor 88A to induce the first current $I_A$. The first MCP voltage $V_A$ also causes the first charge pump circuitry 72A to output the first voltage $V_{CCA}$ (APT voltage) at the first tracker output 70A.

The second charge pump circuitry 72B includes a second MCP 86B and a second inductor 88B. The second MCP 86B is configured to generate a second MCP voltage $V_B$ below the battery voltage $V_{BAT}$, equal to the battery voltage $V_{BAT}$, or two times the battery voltage $V_{BAT}$. The second MCP voltage $V_B$ causes the second inductor 88B to induce the second current $I_B$. The second MCP voltage $V_B$ also causes the second charge pump circuitry 72B to output the second voltage $V_{CCB}$ (APT voltage) at the second tracker output 70B.

In the HPHB mode, the control circuitry 82 controls the first charge pump circuitry 72A and the second charge pump circuitry 72B to provide the first current $I_A$ and the second current $I_B$, respectively, to the dual-mode amplifier circuit 64. More specifically, the control circuitry 82 may close the switches $S_A$ and $S_B$ such that the first current $I_A$ and the second current $I_B$ can be provided to the dual-mode amplifier circuit 64. The control circuitry 82 also controls a selected charge pump circuitry among the first charge pump circuitry 72A and the second charge pump circuitry 72B to provide a selected voltage among the first voltage $V_{CCA}$ (APT voltage) and the second voltage $V_{CCB}$ (APT voltage) to the dual-mode amplifier circuit 64.

The first current IA may be substantially equal to the second current IB (e.g., $I_A=I_B\pm0.1$ mA, and vice versa). As such, a load current $I_{LOAD}$ flowing through the dual-mode amplifier circuit 64 equals a sum of the first current $I_A$ and the second current $I_B$. Accordingly, the dual-mode amplifier circuit 64 can amplify the RF signal 66 to the defined power level $P_{OUT}$ corresponding to the selected voltage multiplied by the sum of the first current $I_A$ and the second current $I_B$.

For example, the selected voltage is at 5 V and the first current $I_A$ and the second current $I_B$ are each at 330 mA. In this regard, the peak load current $I_{LOAD}$ can be up to 660 mA. As a result, if PAE of the dual-mode amplifier circuit is maintained at 45%, the dual-mode amplifier circuit 64 would be able to amplify the RF signal 66 up to 31.72 dBm.

In a non-limiting example, in the HPHB mode, the control circuitry 82 controls the first charge pump circuitry 72A to provide the first voltage $V_{CCA}$ to the dual-mode amplifier circuit 64 as the selected voltage. The control circuitry 82 further controls the first charge pump circuitry 72A and the second charge pump circuitry 72B to provide the first current $I_A$ and the second current $I_B$ to the dual-mode amplifier circuit 64. Accordingly, the dual-mode amplifier circuit 64 amplifies the RF signal 66 to the defined power level $P_{OUT}$ corresponding to the first voltage $V_{CCA}$ multiplied by the sum of the first current $I_A$ and the second current $I_B$.

Alternatively, in the HPHB mode, the control circuitry 82 can activate the second charge pump circuitry 72B to provide the second voltage $V_{CCB}$ to the dual-mode amplifier circuit 64 as the selected voltage. The control circuitry 82 further controls the first charge pump circuitry 72A and the second charge pump circuitry 72B to provide the first current $I_A$ and the second current $I_B$ to the dual-mode amplifier circuit 64. Accordingly, the dual-mode amplifier circuit 64 amplifies the RF signal 66 to the defined power level $P_{OUT}$ corresponding to the second voltage $V_{CCB}$ multiplied by the sum of the first current $I_A$ and the second current $I_B$.

The multi-mode mobile power management circuit 62 includes supply voltage circuitry 90 configured to provide the first target voltage $V_{TARGETA}$ and the second target voltage $V_{TARGETB}$ to the first parallel amplifier 74A and the second parallel amplifier 74B, respectively. The supply voltage circuitry 90 includes a first low dropout regulator (LDO) 92A and a second LDO 92B. When both the first parallel amplifier 74A and the second parallel amplifier 74B are activated (e.g., in a dual-transmit (DTX) operation), the first LDO 92A provides a first APT modulated voltage $V_{APTA}$ to the first parallel amplifier 74A as the first target voltage $V_{TARGETA}$ and the second LDO 92B provides a second APT modulated voltage $V_{APTB}$ to the second parallel amplifier 74B as the second target voltage $V_{TARGETB}$.

The supply voltage circuitry 90 includes switches $S_{1A}$, $S_{2A}$, $S_{1B}$, and $S_{2B}$. Notably, the switches as shown in FIG. 4 are only for illustration and should not be considered as being limiting. The control circuitry 82 may close switches $S_{1A}$ and $S_{1B}$ to couple the first LDO 92A and the second LDO 92B to the first parallel amplifier 74A and the second parallel amplifier 74B, respectively. As such, the first APT modulated voltage $V_{APTA}$ and the second APT modulated voltage $V_{APTB}$ are provided to the first parallel amplifier 74A and the second parallel amplifier 74B as the first target voltage $V_{TARGETA}$ and the second target voltage $V_{TARGETB}$, respectively. Accordingly, the first parallel amplifier 74A generates the first modulated voltage $V_{CCA}$ as the first APT modulated voltage. Likewise, the second parallel amplifier 74B generates the second modulated voltage $V_{CCB}$ as the second APT modulated voltage.

The control circuitry 82 may close switch $S_{2A}$ to couple the second tracker output 70B to the first parallel amplifier 74A. In this regard, the second modulated voltage $V_{CCB}$ is provided to the first parallel amplifier 74A as the first target voltage $V_{TARGETA}$. Notably, the second modulated voltage $V_{CCB}$ can be ET modulated. Accordingly, the first target voltage $V_{TARGETA}$ becomes ET modulated as well. As a result, the first modulated voltage $V_{CCA}$ generated by the first parallel amplifier 74A can be ET modulated.

The control circuitry 82 may close switch $S_{2B}$ to couple the first tracker output 70A to the second parallel amplifier 74B. In this regard, the first modulated voltage $V_{CCA}$ is provided to the second parallel amplifier 74B as the second target voltage $V_{TARGETB}$. Notably, the first modulated voltage $V_{CCA}$ can be ET modulated. Accordingly, the second target voltage $V_{TARGETB}$ becomes ET modulated as well. As a result, the second modulated voltage $V_{CCB}$ generated by the second parallel amplifier 74B can be ET modulated.

In this regard, in the HPHB mode, concurrent to controlling the first charge pump circuitry 72A and the second charge pump circuitry 72B to provide the first current $I_A$ and the second current $I_B$ to the dual-mode amplifier circuit 64, the control circuitry 82 may also control the first parallel amplifier 74A to provide the first modulated voltage $V_{CCA}$ to the dual-mode amplifier circuit 64. Accordingly, the dual-mode amplifier circuit 64 can amplify the RF signal 66 to the defined power level $P_{OUT}$ corresponding to the first modulated voltage $V_{CCA}$ multiplied by the sum of the first current $I_A$ and the second current $I_B$.

Alternatively, in the HPHB mode, concurrent to controlling the first charge pump circuitry 72A and the second charge pump circuitry 72B to provide the first current $I_A$ and the second current $I_B$ to the dual-mode amplifier circuit 64, the control circuitry 82 may also control the second parallel amplifier 74B to provide the second modulated voltage $V_{CCB}$ to the dual-mode amplifier circuit 64. Accordingly, the dual-mode amplifier circuit 64 can amplify the RF signal 66 to the defined power level $P_{OUT}$ corresponding to the second modulated voltage $V_{CCB}$ multiplied by the sum of the first current $I_A$ and the second current $I_B$.

The multi-mode mobile power management circuit 62 includes one or more first amplifier circuits 94(1)-94(M). The first amplifier circuits 94(1)-94(M) are coupled to the first tracker output 70A. In a non-limiting example, the first amplifier circuits 94(1)-94(M) include an LTE mid-low-band (MLB) amplifier circuit 96 and an LTE low-band (LB) amplifier circuit 98. The LTE MLB amplifier circuit 96 is configured to amplify the RF signal 66 for transmission in LTE MLB between 1700-1900 MHz. The LTE LB amplifier circuit 98 is configured to amplify the RF signal 66 for transmission in LTE LB between 450-960 MHz.

The multi-mode mobile power management circuit 62 includes one or more second amplifier circuits 100(1)-100(N). The second amplifier circuits 100(1)-100(N) are coupled to the second tracker output 70B. In a non-limiting example, the second amplifier circuits 100(1)-100(N) include an LTE high-band (HB) amplifier circuit 102 and an LTE mid-band (MB) amplifier circuit 104. The LTE HB amplifier circuit 102 is configured to amplify the RF signal 66 for transmission in LTE HB between 2300-2700 MHz. The LTE MB amplifier circuit 104 is configured to amplify the RF signal 66 for transmission in LTE MB between 1950-2200 MHz.

A selected LTE amplifier circuit among the LTE MLB amplifier circuit 96, the LTE LB amplifier circuit 98, the LTE HB amplifier circuit 102, and the LTE MB amplifier circuit 104 can be configured to amplify the RF signal 66 for transmission in a selected 4G RF band (e.g., LTE LB/MLB/MB/HB) concurrently with the RF signal 66 transmitted in the 5G-NR RF band. Such concurrent transmission of the RF signal 66 in different RF bands is known as ULCA. As discussed in detail below, the multi-mode mobile power management circuit 62 can support ULCA by operating in the LPHB mode or the LPLB mode.

In one non-limiting example, in the LPHB mode, the control circuitry 82 controls the first charge pump circuitry 72A to provide the first voltage $V_{CCA}$ (APT voltage) and the first current $I_A$ to the dual-mode amplifier circuit 64. In this regard, the dual-mode amplifier circuit 64 amplifies the RF signal 66 based on APT modulation for transmission in the 5G-NR RF band. Alternatively, the control circuitry 82 may control the first parallel amplifier 74A and the first charge pump circuitry 72A to provide the first modulated voltage $V_{CCA}$ (ET voltage) and the first current $I_A$, respectively, to the dual-mode amplifier circuit 64. In this regard, the dual-mode amplifier circuit 64 amplifies the RF signal 66 based on ET modulation for transmission in the 5G-NR RF band.

To support ULCA in the LPHB mode, the control circuitry 82 controls the second charge pump circuitry 72B to provide the second voltage $V_{CCB}$ (APT voltage) and the second current $I_B$ to a selected second amplifier circuit (e.g., the LTE HB amplifier circuit 102) among the second amplifier circuits 100(1)-100(N). Accordingly, the selected second amplifier circuit amplifies the RF signal 66 based on APT modulation for transmission in at least one 4G RF band (e.g., LTE HB) that is different from the 5G-NR RF band. Alternatively, the control circuitry 82 may control the second parallel amplifier 74B and the second charge pump circuitry 72B to provide the second modulated voltage $V_{CCB}$ (ET voltage) and the second current $I_B$, respectively, to the selected second amplifier circuit. Accordingly, the selected second amplifier circuit amplifies the RF signal 66 based on ET modulation for transmission in the 4G RF band.

Notably, when the RF signal 66 is transmitted in the 5G-NR RF band in ULCA, peak power of the RF signal 66 would be 3 dB lower than the peak power associated with transmitting the RF signal 66 in the 5G-NR RF band without ULCA. In this regard, the peak power of the RF signal 66 only needs to be around 25.5 dBm (28.5 dBm-3 dB), as opposed to the 28.5 dBm peak power as described earlier in FIG. 2. Accordingly, if PAE of the dual-mode amplifier circuit 64 remains at 45% and the first modulated voltage $V_{CCA}$ is maintained at 5 V, the peak current required by the dual-mode amplifier circuit 64 would only be approximately 157.69 mA. As such, the first current $I_A$ supplied by the first charge pump circuitry 72A, which can be up to 330 mA as described in FIG. 3, is sufficient for driving the dual-mode amplifier circuit 64. As a result, the second charge pump circuitry 72B can be freed up to support the selected second amplifier circuit.

In another non-limiting example, in the LPHB mode, the control circuitry 82 controls the second charge pump circuitry 72B to provide the second voltage $V_{CCA}$ (APT voltage) and the second current $I_B$ to the dual-mode amplifier circuit 64. In this regard, the dual-mode amplifier circuit 64 amplifies the RF signal 66 based on APT modulation for transmission in the 5G-NR RF band. Alternatively, the control circuitry 82 may control the second parallel amplifier 74B and the second charge pump circuitry 72B to provide the second modulated voltage $V_{CCB}$ (ET voltage) and the second current $I_B$, respectively, to the dual-mode amplifier circuit 64. In this regard, the dual-mode amplifier circuit 64 amplifies the RF signal 66 based on ET modulation for transmission in the 5G-NR RF band.

To support ULCA in the LPHB mode, the control circuitry 82 controls the first charge pump circuitry 72A to provide the first voltage $V_{CCA}$ (APT voltage) and the first current $I_A$ to a selected first amplifier circuit (e.g., the LTE MLB amplifier circuit 96) among the first amplifier circuits 94(1)-94(M). Accordingly, the selected first amplifier circuit amplifies the RF signal 66 based on APT modulation for transmission in at least one 4G RF band (e.g., LTE MLB) that is different from the 5G-NR RF band. Alternatively, the control circuitry 82 may control the first parallel amplifier 74A and the first charge pump circuitry 72A to provide the first modulated voltage $V_{CCB}$ (ET voltage) and the first current $I_A$, respectively, to the selected first amplifier circuit. Accordingly, the selected first amplifier circuit amplifies the RF signal 66 based on ET modulation for transmission in the 4G RF band.

Notably, when the RF signal 66 is transmitted in the 5G-NR RF band in ULCA, peak power of the RF signal 66 would be 3 dB lower than the peak power associated with transmitting the RF signal 66 in the 5G-NR RF band without ULCA. In this regard, the peak power of the RF signal 66 only needs to be around 25.5 dBm (28.5 dBm-3 dB), as opposed to the 28.5 dBm peak power as described earlier in FIG. 2. Accordingly, if PAE of the dual-mode amplifier circuit 64 remains at 45% and the second modulated voltage $V_{CCB}$ is maintained at 5 V, the peak current required by the dual-mode amplifier circuit 64 would only be approximately 157.69 mA. As such, the second current $I_B$ supplied by the second charge pump circuitry 72B, which can be up to 330 mA as described in FIG. 3, is sufficient for driving the dual-mode amplifier circuit 64. As a result, the first charge pump circuitry 72A can be freed up to support the selected first amplifier circuit.

In another non-limiting example, in the LPLB mode, the control circuitry 82 controls the first charge pump circuitry 72A to provide the first voltage $V_{CCA}$ (APT voltage) and the first current $I_A$ to the dual-mode amplifier circuit 64. In this regard, the dual-mode amplifier circuit 64 amplifies the RF signal 66 based on APT modulation for transmission in the 5G-NR RF band. Alternatively, the control circuitry 82 may control the first parallel amplifier 74A and the first charge pump circuitry 72A to provide the first modulated voltage $V_{CCA}$ (ET voltage) and the first current $I_A$, respectively, to the dual-mode amplifier circuit 64. In this regard, the dual-mode amplifier circuit 64 amplifies the RF signal 66 based on ET modulation for transmission in the 5G-NR RF band.

To support ULCA in the LPHB mode, the control circuitry 82 controls the second charge pump circuitry 72B to provide the second voltage $V_{CCB}$ (APT voltage) and the second current $I_B$ to a selected second amplifier circuit (e.g., the LTE HB amplifier circuit 102) among the second amplifier circuits 100(1)-100(N). Accordingly, the selected second amplifier circuit amplifies the RF signal 66 based on APT modulation for transmission in at least one 4G RF band (e.g., LTE HB) that is different from the 5G-NR RF band. Alternatively, the control circuitry 82 may control the second parallel amplifier 74B and the second charge pump circuitry 72B to provide the second modulated voltage $V_{CCB}$ (ET voltage) and the second current $I_B$, respectively, to the selected second amplifier circuit. Accordingly, the selected second amplifier circuit amplifies the RF signal 66 based on ET modulation for transmission in the 4G RF band.

In another non-limiting example, in the LPLB mode, the control circuitry 82 controls the second charge pump circuitry 72B to provide the second voltage $V_{CCA}$ (APT voltage) and the second current $I_B$ to the dual-mode amplifier circuit 64. In this regard, the dual-mode amplifier circuit 64 amplifies the RF signal 66 based on APT modulation for transmission in the 5G-NR RF band. Alternatively, the control circuitry 82 may control the second parallel amplifier 74B and the second charge pump circuitry 72B to provide the second modulated voltage $V_{CCB}$ (ET voltage) and the second current $I_B$, respectively, to the dual-mode amplifier circuit 64. In this regard, the dual-mode amplifier circuit 64 amplifies the RF signal 66 based on ET modulation for transmission in the 5G-NR RF band.

To support ULCA in the LPHB mode, the control circuitry 82 controls the first charge pump circuitry 72A to provide the first voltage $V_{CCA}$ (APT voltage) and the first current $I_A$ to a selected first amplifier circuit (e.g., the LTE MLB amplifier circuit 96) among the first amplifier circuits 94(1)-94(M). Accordingly, the selected first amplifier circuit amplifies the RF signal 66 based on APT modulation for transmission in at least one 4G RF band (e.g., LTE MLB) that is different from the 5G-NR RF band. Alternatively, the control circuitry 82 may control the first parallel amplifier 74A and the first charge pump circuitry 72A to provide the first modulated voltage $V_{CCB}$ (ET voltage) and the first current $I_A$, respectively, to the selected first amplifier circuit. Accordingly, the selected first amplifier circuit amplifies the RF signal 66 based on ET modulation for transmission in the 4G RF band.

Those skilled in the art will recognize improvements and modifications to the preferred embodiments of the present disclosure. All such improvements and modifications are considered within the scope of the concepts disclosed herein and the claims that follow.

What is claimed is:

1. A multi-mode mobile power management circuit, comprising:
   a dual-mode amplifier circuit configured to amplify a radio frequency (RF) signal for transmission in at least one defined RF band;
   first tracker circuitry comprising:
   a first tracker output coupled to the dual-mode amplifier circuit; and
   first charge pump circuitry configured to generate a first voltage and a first current at the first tracker output; and
   second tracker circuitry comprising:
   a second tracker output coupled to the dual-mode amplifier circuit; and
   second charge pump circuitry configured to generate a second voltage and a second current at the second tracker output; and
   control circuitry configured to control the first charge pump circuitry and the second charge pump circuitry to provide the first current and the second current to the dual-mode amplifier circuit in a high-power high-bandwidth (HPHB) mode;
   wherein the dual-mode amplifier circuit is further configured to amplify the RF signal to a defined power level corresponding to a sum of the first current and the second current.

2. The multi-mode mobile power management circuit of claim 1 wherein, in the HPHB mode, the first current substantially equals the second current.

3. The multi-mode mobile power management circuit of claim 1 wherein in the HPBH mode:
   the control circuitry is further configured to control a selected charge pump circuitry among the first charge pump circuitry and the second charge pump circuitry to provide a selected voltage among the first voltage and the second voltage to the dual-mode amplifier circuit; and
   the dual-mode amplifier circuit is further configured to amplify the RF signal to the defined power level corresponding to the selected voltage multiplied by the sum of the first current and the second current.

4. The multi-mode mobile power management circuit of claim 3 wherein, in the HPHB mode, the selected voltage is an average power tracking (APT) voltage.

5. The multi-mode mobile power management circuit of claim 1 wherein, in the HPHB mode:
the control circuitry is further configured to control the first charge pump circuitry to provide the first voltage to the dual-mode amplifier circuit; and
the dual-mode amplifier circuit is further configured to amplify the RF signal to the defined power level corresponding to the first voltage multiplied by the sum of the first current and the second current.

6. The multi-mode mobile power management circuit of claim 1 wherein, in the HPHB mode:
the control circuitry is further configured to control the second charge pump circuitry to provide the second voltage to the dual-mode amplifier circuit; and
the dual-mode amplifier circuit is further configured to amplify the RF signal to the defined power level corresponding to the second voltage multiplied by the sum of the first current and the second current.

7. The multi-mode mobile power management circuit of claim 1 wherein, in the HPHB mode, the dual-mode amplifier circuit is further configured to amplify the RF signal for transmission in a fifth-generation new-radio (5G-NR) band or a long-term evolution (LTE) band selected from the group consisting of: LTE band 42; LTE band 43; and LTE band 48.

8. The multi-mode mobile power management circuit of claim 1 wherein:
the first tracker circuitry further comprises a first parallel amplifier coupled to the first tracker output and configured to generate a first modulated voltage at the first tracker output; and
the second tracker circuitry further comprises a second parallel amplifier coupled to the second tracker output and configured to generate a second modulated voltage at the second tracker output.

9. The multi-mode mobile power management circuit of claim 8 wherein:
the first modulated voltage is a first envelope tracking (ET) modulated voltage; and
the second modulated voltage is a second ET modulated voltage.

10. The multi-mode mobile power management circuit of claim 8 wherein, in the HPHB mode:
the control circuitry is further configured to:
control the first parallel amplifier to provide the first modulated voltage to the dual-mode amplifier circuit; and
control the first charge pump circuitry to not provide the first voltage to the dual-mode amplifier circuit; and
the dual-mode amplifier circuit is further configured to amplify the RF signal to the defined power level corresponding to the first modulated voltage.

11. The multi-mode mobile power management circuit of claim 8 wherein, in the HPHB mode:
the control circuitry is further configured to:
control the second parallel amplifier to provide the second modulated voltage to the dual-mode amplifier circuit; and
control the first charge pump circuitry to not provide the second voltage to the dual-mode amplifier circuit; and the dual-mode amplifier circuit is further configured to amplify the RF signal to the defined power level corresponding to the second modulated voltage.

12. The multi-mode mobile power management circuit of claim 8 further comprising:
one or more first amplifier circuits coupled to the first tracker output; and
one or more second amplifier circuits coupled to the second tracker output.

13. The multi-mode mobile power management circuit of claim 12 wherein in a low-power high-bandwidth (LPHB) mode, the control circuitry is further configured to control the first charge pump circuitry to provide the first voltage and the first current to the dual-mode amplifier circuit.

14. The multi-mode mobile power management circuit of claim 13 wherein:
the control circuitry is further configured to control the second charge pump circuitry to provide the second voltage and the second current to a selected second amplifier circuit among the one or more second amplifier circuits; and
the selected second amplifier circuit is configured to amplify the RF signal for transmission in at least one fourth-generation (4G) RF band different from the at least one defined RF band.

15. The multi-mode mobile power management circuit of claim 12 wherein in a low-power high-bandwidth (LPHB) mode, the control circuitry is further configured to control the second charge pump circuitry to provide the second voltage and the second current to the dual-mode amplifier circuit.

16. The multi-mode mobile power management circuit of claim 15 wherein:
the control circuitry is further configured to control the first charge pump circuitry to provide the first voltage and the first current to a selected first amplifier circuit among the one or more first amplifier circuits; and
the selected first amplifier circuit is configured to amplify the RF signal for transmission in at least one fourth-generation (4G) RF band different from the at least one defined RF band.

17. The multi-mode mobile power management circuit of claim 12 wherein in a low-power high-bandwidth (LPHB) mode, the control circuitry is further configured to control the first parallel amplifier and the first charge pump circuitry to provide the first modulated voltage and the first current to the dual-mode amplifier circuit, respectively.

18. The multi-mode mobile power management circuit of claim 17 wherein:
the control circuitry is further configured to control the second parallel amplifier and the second charge pump circuitry to provide the second modulated voltage and the second current to a selected second amplifier circuit among the one or more second amplifier circuits; and
the selected second amplifier circuit is configured to amplify the RF signal for transmission in at least one fourth-generation (4G) RF band different from the at least one defined RF band.

19. The multi-mode mobile power management circuit of claim 12 wherein: in a low-power high-bandwidth (LPHB) mode, the control circuitry is further configured to control the second parallel amplifier and the second charge pump circuitry to provide the second modulated voltage and the second current to the dual-mode amplifier circuit, respectively.

20. The multi-mode mobile power management circuit of claim 19 wherein:

the control circuitry is further configured to control the first parallel amplifier and the first charge pump circuitry to provide the first modulated voltage and the first current to a selected first amplifier circuit among the one or more first amplifier circuits; and the selected first amplifier circuit is configured to amplify the RF signal for transmission in at least one fourth-generation (4G) RF band different from the at least one defined RF band.

* * * * *